(12) United States Patent
Brugger et al.

(10) Patent No.: US 8,936,832 B2
(45) Date of Patent: *Jan. 20, 2015

(54) DEVICE AND METHOD FOR WET TREATING PLATE-LIKE-ARTICLES

(75) Inventors: Michael Brugger, Millstatt (AT); Alexander Schwarzfurtner, Moosburg (AT)

(73) Assignee: Lam Research AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 13/333,004

(22) Filed: Dec. 21, 2011

(65) Prior Publication Data

US 2012/0085374 A1 Apr. 12, 2012

Related U.S. Application Data

(62) Division of application No. 12/519,232, filed as application No. PCT/EP2007/062489 on Nov. 19, 2007, now Pat. No. 8,231,939.

(30) Foreign Application Priority Data

Dec. 15, 2006 (AT) .................. A 2073/2006

(51) Int. Cl.
*B05D 3/12* (2006.01)
*B05C 11/02* (2006.01)
*B05C 5/00* (2006.01)
*H01L 21/687* (2006.01)
(Continued)

(52) U.S. Cl.
CPC .......... *H01L 21/68735* (2013.01); *G03F 7/162* (2013.01); *H01L 21/67023* (2013.01); *H01L 21/6704* (2013.01); *H01L 21/67051* (2013.01);
(Continued)

(58) Field of Classification Search
CPC ..... B05D 1/005; G03F 7/162; H01L 21/6715; H01L 21/6704; H01L 21/67023; H01L 21/67075

USPC ........... 427/240, 425; 118/52, 320, 500, 501; 438/758, 780, 782
See application file for complete search history.

(56) References Cited

U.S. PATENT DOCUMENTS 4,856,456 A 8/1989 Hillman et al.
5,439,519 A 8/1995 Sago et al.
(Continued)

OTHER PUBLICATIONS

International Search Report dated May 9, 2008, from corresponding PCT application No. PCT/EP07/62489.

*Primary Examiner* — Kirsten Jolley
(74) *Attorney, Agent, or Firm* — Young & Thompson

(57) ABSTRACT

A method for wet treatment of plate-like articles includes, a chuck for holding a single plate-like article having an upwardly facing surface for receiving liquid running off a plate-like article when being treated with liquid, wherein the chuck is outwardly bordered by a circumferential annular lip. The chuck has an outer diameter greater than the greatest diameter of the plate-like article to be treated, and a rotatable part with an upwardly facing ring-shaped surface for receiving liquid running off the circumferential lip of the chuck. The rotatable part is rotatable with respect to the chuck, the ring-shaped surface is coaxially arranged with respect to the circumferential annular lip, the inner diameter of the ring-shaped surface is smaller than the outer diameter of the chuck, and the distance d between the lip and the upwardly facing ring-shaped surface is in a range from 0.1 mm to 5 mm.

18 Claims, 2 Drawing Sheets

(51) Int. Cl.
    *G03F 7/16* (2006.01)
    *H01L 21/67* (2006.01)
(52) U.S. Cl.
    CPC .... *H01L 21/67063* (2013.01); *H01L 21/67075* (2013.01); *H01L 21/6708* (2013.01); *H01L 21/6715* (2013.01)
    USPC ............. 427/240; 427/425; 118/52; 118/320; 118/500; 118/501; 438/758; 438/780; 438/782

(56) References Cited

U.S. PATENT DOCUMENTS

| | | | |
|---|---|---|---|
| 5,513,668 | A | 5/1996 | Sumnitsch |
| 6,306,455 | B1 | 10/2001 | Takamori et al. |
| 7,632,352 | B2 * | 12/2009 | Kang et al. ................ 118/52 |
| 2003/0056898 | A1 | 3/2003 | Obweger |
| 2005/0223975 | A1 | 10/2005 | Hohenwarter |

* cited by examiner

DEVICE AND METHOD FOR WET TREATING PLATE-LIKE-ARTICLES

The invention relates to a device for wet treatment of plate-like articles comprising a chuck for holding a single plate-like article comprising an upwardly facing surface for receiving liquid running off a plate-like article when being treated with liquid.

Such devices for wet treatment of plate-like articles typically replace so called wet benches where a plurality of plate-like articles are treated at the same time.

Such plate-like articles can be disc-like articles such as semiconductor wafers, or compact discs as well as polygonal articles such as flat panel displays.

Devices for single plate-like article wet treatment use rotating of the plate-like article so that liquid, which has been dispensed onto the plate-like article, can be effectively removed from the plate-like article by spinning the liquid off, and the liquid is then collected by a circumferential liquid collector. Consequently the treatment liquid flows over the plate-like article with a minimum speed. However, some processes, which are used in wet benches, sometimes need wet processes where the liquid shall remain on the plate-like article or shall slowly run across the plate-like article's surface. For such process it seemed impossible to use single processors where the liquid is spun off into a circumferential liquid collector.

Another problem, which occurs with the above-mentioned devices for wet treatment of a single plate-like article, is that a high volumetric flow rate of the liquid that is dispensed onto the plate-like article is necessary to keep the plate-like article completely wet during the process. The requirements to keep the plate-like article's surface wet on the one hand and to spin the liquid off on the other hand seem to contradict each other.

Therefore it is an object of the invention to provide a device and a process technique, which makes it possible to use slow flowing liquid in single plate-like article wet processors.

The invention meets the objects of the invention by providing a device for wet treatment of plate-like articles comprising:
 a chuck for holding a single plate-like article comprising an upwardly facing surface for receiving liquid running off a single plate-like article when being treated with liquid, wherein the chuck is outwardly bordered by a circumferential annular lip, wherein the chuck has an outer diameter grater than the greatest diameter of the plate-like article to be treated, and
 a rotatable part with an upwardly facing ring-shaped surface for receiving liquid running off the circumferential lip of the chuck, the rotatable part is rotatable with respect to the chuck, the ring-shaped surface is coaxially arranged with respect to the circumferential annular lip, the inner diameter of the ring-shaped surface is smaller than the outer diameter of the chuck, and the distance d between the lip and the upwardly facing ring-shaped surface is in a range from 0.1 mm to 5 mm.

This configuration of a chuck for holding a plate-like article and a surrounding rotatable ring-shaped surface brings the advantage that no matter whether the chuck rotates or does not rotate or how fast the chuck rotates the liquid flows onto the rotating ring-surface and is radially flung off. Above a certain spin speed the liquid does not contact the rotating ring. The liquid can therefore be collected in a circumferentially arranged liquid collector. If a multi stage liquid collector is used, which has two or more collecting levels underneath each other, liquids, which shall not be collected in the same collector (either because of compatibility reasons or in order to separately reuse the liquids), can be separately collected when radially flung off the rotating ring-shaped surface of the rotating part. For changing from one collecting level to another the collector and the ring-shaped surface are vertically moved relative to each other.

In a preferred embodiment the chuck is rotatable, which brings the advantage that the plate-like article can selectively be treated whilst rotating or whilst standing still. E.g. the plate-like article can be treated by a photoresist stripping liquid (e.g. mixture of organic solvents) at 0 rpm, rinsed thereafter at a 10 to 200 rpm and then spin dried at 3000 rpm. During all these treatments at different spin speeds the rotatable ring-surface may spin at the same spin speed, e.g. 200 rpm. Below 100 rpm it is expected that liquid flows from the circumferential annular lip onto the rotating ring-surface, however this depends not only on the spin speed but also on other parameters such as surface tension and viscosity of the liquid and volumetric flow rate of the liquid.

If the device further comprises liquid dispensing means for dispensing liquid onto the surface not facing the chuck (the upwardly facing surface of the plate-like article) liquid can remain on the upwardly facing surface of the plate-like article and can freely flow across the surface only supported by gravity, without any support of adhesion of the liquid on the plate-like article's surface.

When the distance d is in a range from 0.1 mm to 2 mm the gap is small enough that no liquid flows into the gap. Preferably the distance d is not more than 0.5 mm.

Advantageously the circumferential annular lip is formed, so that the outer edge of the lip is facing downward, liquid flows towards the edge of the chuck solely driven by gravity. This allows running a process at a chuck speed of 0 rpm and at the same time accelerating the liquid from the chuck into a liquid collector. Preferably the upwardly facing surface of the chuck has a bevel-shaped edge area, wherein the bevel-shaped edge area has the size of 0.5 mm to 10 mm from the edge.

In another embodiment the rotatable part is part of or mounted to a rotatable bowl with the chuck being arranged within the bowl, whereby a gap is formed between the chuck and the bowl, wherein the gap has a distance in the range between 0.05 mm and 20 mm. This embodiment brings the advantage that if liquid may run into the gap between the rotatable part and the chuck that such liquid will be driven out by centrifugal force even if the chuck does not rotate. This effect can be further supported when the bowl has openings being located underneath the chuck, wherein the openings are in communication with a gas source for transferring gas into the gap between the bowl and the chuck. Said gas source is ambient air.

As an alternative to the bowl the rotatable part can be a ring which is rotatably mounted directly to the chuck and driven by a motor, which is mounted in the chuck. Such a rotatable ring can also be pneumatically driven by a pressurized gas.

In yet another embodiment the chuck further comprises a gas feed means for at least partial gas purging of the plate-like article's surface, which faces the chuck, wherein a peripheral side of the chuck includes a first gas guiding device which routes most of the purging gas away from the edge area of the plate-like article. This first gas guiding device avoids that gas, which has been introduced into the gap between the plate-like article and the chuck collides with the liquid that flows over the plate-like article's edge onto the upwardly facing chuck surface for receiving liquid. This omits bubbles or splashes being generated by gas which might flow out of the gap between the plate-like article's edge and the upwardly facing chuck surface.

Advantageously the first gas guiding device has the form of an annular nozzle, which is outwardly bordered by an inwardly facing annular edge with a diameter, which is smaller than the plate-like article to be treated. The diameter of the annular edge is preferably at least 0.5 mm smaller than the diameter of the plate-like article.

Preferably the device is equipped with a second gas guiding device underneath the rotatable ring-shaped surface for further guiding gas coming from the first gas guiding device radially outwards. This second gas guiding device avoids that gas, which comes from the first gas guiding device and/or from the gap between the chuck and the rotatable part, collides with the liquid that flows over the circumferential annular lip of the chuck onto the ring-shaped surface of the rotatable part. This omits bubbles or splashes being generated by gas which might flow out of the gap between the circumferential annular lip and the ring-shaped surface.

Another aspect of the invention is a method for wet treatment of plate-like articles comprising:

placing a plate-like article on a chuck for horizontally holding a plate-like article, the chuck having an upwardly facing surface at least underneath the plate-like article's edge, dispensing liquid onto the upwardly facing surface of the plate-like article letting the liquid flow towards the edge of the plate-like article letting the liquid run off the plate-like article onto the upwardly facing surface of the chuck, which surface is outwardly bordered by a circumferential lip, wherein the chuck has an outer diameter greater than the greatest diameter of the plate-like article to be treated, letting the liquid run off the upwardly facing surface over the circumferential lip of the chuck onto an upwardly facing rotating ring surface, whereby the liquid is accelerated and spun off the rotating ring surface, wherein the rotating surface is rotating faster than the plate-like article and wherein the inner diameter of the rotating ring is smaller than the outer diameter of the chuck, and the distance d between the lip and the upwardly facing ring surface is in a range from 0.1 mm to 5 mm.

In an embodiment of the method the chuck rotates at a spin speed of a range of 0 rpm to 100 rpm (preferably 0 rpm to 50 rpm).

Preferably the rotating ring surface rotates at a spin speed of above 50 rpm.

Advantageously purging gas is introduced into the gap between the plate-like article and the chuck and the gas flows towards the edge of the plate-like article.

Process results can be further improved if 80 vol.-% of the purging gas is routed away from the edge area of the plate-like article. The results can be further improved if more than 80 vol.-% of the purging gas, which has been routed away from the edge area of the plate-like article, is guided outward underneath the rotating ring surface.

Further details and advantages of the invention will become apparent from the detailed description of a preferred embodiment.

Figure 1:
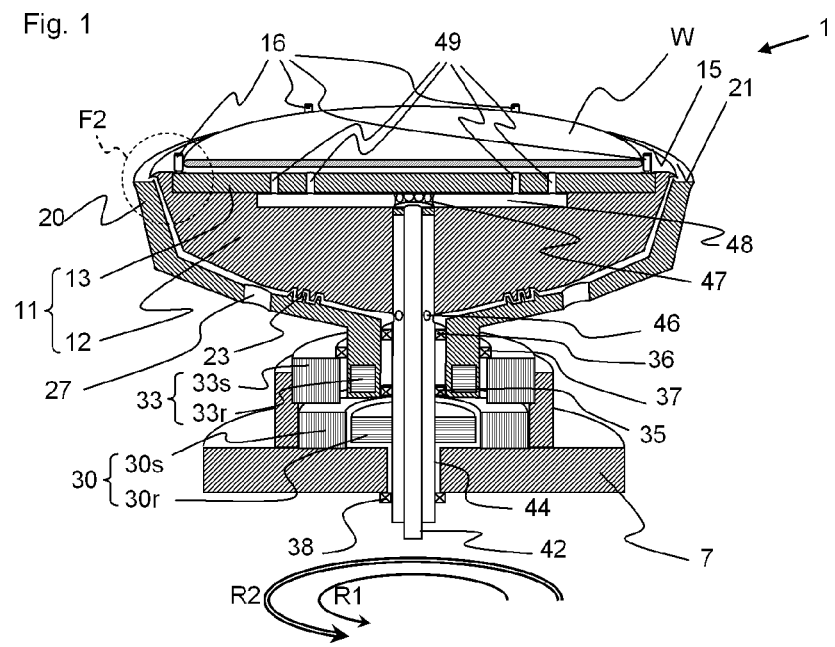
FIG. 1 shows a schematic cross sectional view of a preferred embodiment of the invention.
Figure 2:
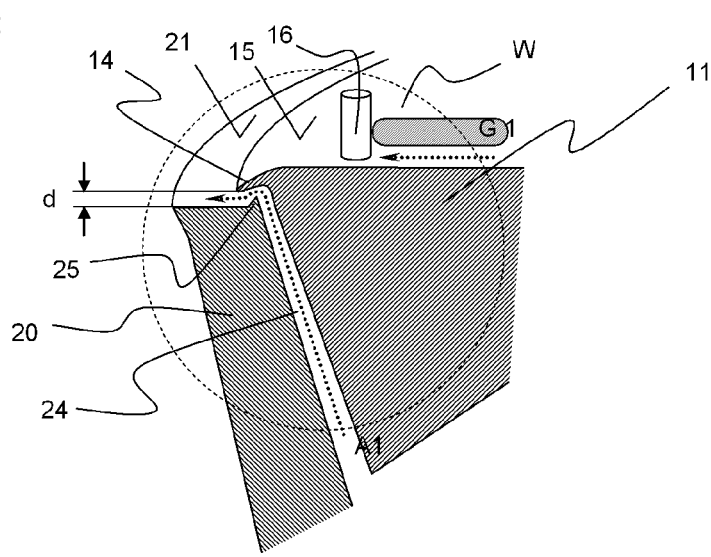
FIG. 2 shows a schematic cross sectional view of a detail F2 out of FIG. 1.
Figure 4:
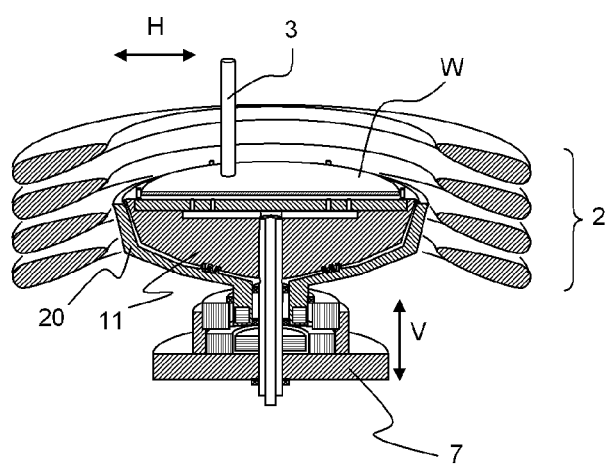
FIG. 4 shows a schematic cross sectional view of a preferred embodiment of the invention within a multi level collector.

FIG. 1, FIG. 2, and FIG. 4 show a schematic cross sectional view of a preferred embodiment of the invented device 1. The device 1 comprises a cup-shaped rotatable part 20 (rotatable bowl 20) with the smaller opening facing down and the larger opening facing up, and a chuck 11, which are coaxially arranged. Both parts the rotatable bowl 20 and the rotatable chuck 11 can be separately driven by different motors 30, 33.

The device 1 is arranged within a multi level liquid collector 2 schematically shown in FIG. 4. An example for a possible liquid collector is shown in US-patent application U.S. 2003/0056898 A1. The chuck 11 together with the rotatable bowl and liquid collector 2 can be vertically moved relative to one another—in other words the axial distance between the rotatable bowl and the chuck is not changed.

A liquid dispensing nozzle 3 is directed towards the upper surface of the chuck 11 in order to dispense liquid onto the upwardly facing surface of a wafer W (plate-like article) when placed on the chuck 11.

The chuck 11 comprises a cover 13 fixed to the top of the chuck's base body 12. Between the base body 12 and the cover 13 a gas distribution chamber 48 is arranged, which feeds gas through conduits 49. Gas is introduced through the conduits 49 for providing a gas-cushion between the chuck 11 and the wafer W, on which the wafer floats. The gas distribution chamber 48 is fed with gas from the hollow shaft 42 through conduits 47 on the upper end of the hollow shaft 42. A plurality of e.g. twenty four upwardly facing gas conduits 49 are arranged in two concentric circles. The gas, which has been introduced into the gap between the wafer and the chuck leaves this gap as gas flow G1 (dotted arrow in FIG. 2).

Six upwardly projecting gripping pins 16 securely grip the wafer W so that it is rotated with the same spin speed as the chuck. The gripping pins 16 are eccentrically movable, which mechanism is not shown. Details for such mechanism can be seen in U.S. Pat. No. 5,513,668.

A second hollow shaft 44 is coaxially arranged with the fist hollow shaft 42. These shafts together are coaxially fixed to the chuck 11 for driving the chuck. The shafts are driven by a first hollow shaft motor 30. The inner rotor 30r of the motor is fixed to the second hollow shaft 44 whereas the outer stator 30s is fixed to a liftable mounting plate 7.

A rotatable bowl 20 is arranged coaxially to the chuck 11 leaving a gap 24 between the chuck 11 and the rotatable bowl 20. The rotatable bowl is driven by a second hollow shaft motor 33.

The stator 33s of second motor 30 is fixed to the liftable mounting plate 7 so that the gap 24 between the rotatable chuck 11 and the rotatable bowl 20 is kept constant when the chuck is lifted. The rotatable bowl 20 is connected to the hollow shaft 44 by ball bearings 36 and 35. The hollow shaft 44 is rotatably connected to the mounting plate 7 by ball bearing 38.

The upwardly facing surface 15 of the chuck 11 is beveled downward at its outer periphery so that a lip 14 is formed, which is bent downward. The bevel-shaped edge area has an extension of 2 mm from the edge. The lip 14 is overlapping the upwardly facing ring surface 21 of the rotatable bowl 20.

Basically the upwardly facing ring surface 21 of the rotatable bowl 20 is planar. However—in order to seal the gap between the lip 14 and the ring surface 21—the plane ring surface 21 has a circumferential burr 25 at its inner diameter. The distance d between the ring surface 21 and the lip 14 is 0.5 mm.

Between the inner hollow shaft 42 and the outer hollow shaft 44 a second gas channel is formed which feeds the gap 24 between the rotatable bowl 20 and the chuck 11 with gas through conduits 46. Therefore particles, which might be generated by ball bearing 36 are moved downward whereas the labyrinth seal 23 between chuck 11 and bowl 20 is purged with clean gas.

A plurality of air conduits 27 are formed into the bowl 20, wherein the conduits 27 have a higher distance to the rotation axis than the labyrinth seal 23. The air conduits 27 feed ambient air through gap 24 towards the gap between the lip 14 and the ring surface 21. The outwardly directed air flow A1 (dotted arrow) in gap 24 is generated when the chuck 11 and/or the bowl 20 rotate. This outwardly directed air flow A1 is generated by centrifugal pump effect. Air flow A1 securely avoids any liquid flowing into the gap 24 between chuck 11 and rotatable bowl 20.

Following the treatment of a wafer with a device according to the first embodiment (details shown in FIG. 1, 2, 4) is described.

Liquid is dispensed onto the upwardly facing wafer surface through liquid dispenser 3. The liquid flows towards the wafer edge, partly wraps around the wafer however does not flow into the gap between the wafer W and the surface 15 because gas G1 flows out of the gap. Excess liquid flows over the surface 15 towards the lip 14 onto the ring surface 21. No matter whether chuck 11 rotates or does not rotate the liquid flows onto the ring surface 21, where it is accelerated by the rotating ring surface 21 and the liquid is flung off the rotating ring surface 21 into the selected liquid collector.

Figure 3:
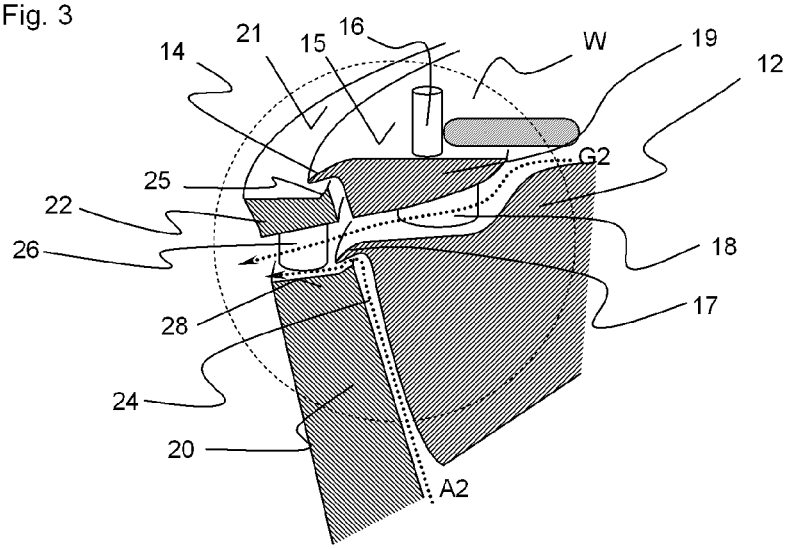
FIG. 3 shows a detail as in FIG. 2 however showing an embodiment with a gas guiding ring (e.g. capillary ring).

FIG. 3 shows a second embodiment of the current invention based on the detailed view of FIG. 2. This embodiment differs from the first embodiment because it provides an additional gas path G2 for the gas, the gas which has been introduced by conduits 49 (as shown in FIG. 1). The gas used for the gas cushion, on which the wafer floats, is routed away from the peripheral area of the wafer. The gas guiding device 19 for routing the gas away from the wafer has the form of a ring mounted onto the chuck 11 by spacers 18. Alternatively the gas guiding device can be directly formed out of the chuck base-body. The upwardly facing surface 15 of the gas guiding device is a plane parallel to the wafer.

A second gas guiding device 22 having the form of a ring is mounted onto the rotatable bowl 20 by spacers 26. Gas (G2) coming from the gap between the first gas guiding device 19 and chuck base-body 12 is guided into the gap between the second gas guiding device 22 and the rotatable bowl 20. The upwardly facing surfaces 15 and 21 have the same functions as in the embodiment shown in FIG. 2.

Like the lip 14 overlaps the ring surface 21 a second lip 17 underneath the lip 14 overlaps the second upwardly facing lower ring surface 28.

Following the treatment of a wafer with a device according to the second embodiment (details shown in FIG. 3) is described.

When the wafer is treated with liquid the liquid flows towards the wafer edge, partly wraps around the wafer into the gap between the wafer W and the surface 15, where it remains during process or flows outwardly underneath the ring 19 towards supported by gas flow G2. Excess liquid (liquid, which does not flow into the gap between the wafer W and the surface 15) flows over the surface 15 towards the lip 14 onto the ring surface 21. After liquid treatment liquid in the gap between the wafer W and the surface 15 is removed e.g. by centrifugal force, or gas flow G2.

No matter whether chuck 11 rotates or does not rotate the liquid flows onto the ring surface 21, where it is accelerated by the rotating ring surface 21 and the liquid is flung off the rotating ring surface 21 by centrifugal force into the selected liquid collector.

Outwardly directed air flow A2 purges the gap between lip 17 and surface 28 and merges with G2 in the gap between surface 28 and ring 22. Thereafter the merged gas flow (A2/G2) is further routed radially outward without colliding with outwardly flowing liquid which is flung off the rotating ring surface 21.

The invention claimed is:

1. A method for wet treatment of plate-like articles in a device, the method comprising the steps of:
    placing a plate-like article on a chuck, of the device, for horizontally holding a plate-like article to be treated, the chuck having an upwardly facing surface at least underneath the plate-like article's edge, the upwardly facing surface being outwardly bordered by a downwardly-turned circumferential lip, the chuck having an outer diameter greater than the greatest diameter of the plate-like article to be treated, the device further including a rotatable part with an upwardly facing ring-shaped surface for receiving liquid running off the circumferential lip of the chuck, the ring-shaped surface located below the chuck, wherein the rotatable part and the ring-shaped surface rotates faster than the plate-like article, and wherein the inner diameter of the ring-shaped surface is smaller than the outer diameter of the chuck so that the circumferential lip of the chuck overlaps an inner edge of the ring-shaped surface allowing the liquid running off the downwardly-turned circumferential lip of the chuck to fall downward onto the upwardly facing rotating ring-shaped surface of the rotatable part along a first gap therebetween,
    dispensing liquid onto the upwardly facing surface of the plate-like article,
    letting the liquid flow towards the edge of the plate-like article,
    letting the liquid run off the plate-like article onto the upwardly facing surface of the chuck, and
    letting the liquid run off the upwardly facing surface over the downwardly-turned circumferential lip of the chuck and fall downward along the first gap onto the upwardly facing rotating ring-shaped surface of the rotatable part, whereafter the liquid is accelerated and radially spun off the rotating ring-shaped surface of the rotatable part;
    wherein the rotatable part comprises air inlets positioned radially inwardly of said first gap and configured to generate an air flow upon rotation of at least one of the rotatable part and the chuck, the air flow proceeding from the air inlets radially outwardly to the first gap so as to purge the first gap.

2. The method according to claim 1 wherein the chuck rotates at a spin speed of a range of 0 rpm to 100 rpm.

3. The method according to claim 1 wherein the rotating ring-shaped surface rotates at a spin speed of above 50 rpm.

4. The method according to claim 1 wherein purging gas is introduced into a second gap between the plate-like article and the chuck and the gas flows towards the edge of the plate-like article.

5. The method of claim 4 wherein more than 80 vol.-% of the purging gas is routed away from the edge area of the plate-like article.

6. The method of claim 5 wherein more than 80 vol.-% of the purging gas, which has been routed away from the edge area of the plate-like article, is guided outward underneath the rotating ring-shaped surface.

7. The method according to claim 1, wherein the chuck is non-rotating.

8. The method according to claim 1, wherein a distance d of the first gap between the lip and the upwardly facing ring-shaped surface is in a range from 0.1 mm to 5 mm.

9. The method according to claim 1, wherein,
the downwardly-turned circumferential lip is a bevel-shaped edge extension, and
in the step of letting the liquid run off the upwardly facing surface and fall downward along the first gap onto the upwardly facing rotating ring-shaped surface, the liquid runs off the bevel-shaped edge extension directly onto the ring-shaped surface of the rotatable part.

10. The method according to claim 9, wherein,
bevel-shaped edge extension extends inwardly 2 mm from the outermost edge of the chuck.

11. The method according to claim 1, wherein,
the rotating ring-shaped surface of the rotatable part is a planar surface from the inner diameter to an outermost diameter of the ring-shaped surface, and
in the step of letting the liquid run off the upwardly facing surface and fall downward along the first gap onto the upwardly facing rotating ring-shaped surface, the liquid is accelerated and radially spun off the planar surface of the rotating ring-shaped surface.

12. The method according to claim 9, wherein,
the rotating ring-shaped surface of the rotatable part is a planar surface from the inner diameter to an outermost diameter of the ring-shaped surface, and
in the step of letting the liquid run off the upwardly facing surface and fall downward along the first gap onto the upwardly facing rotating ring-shaped surface, the liquid is accelerated and radially spun off the planar surface of the rotating ring-shaped surface.

13. The method according to claim 11, wherein,
the rotating ring-shaped surface of the rotatable part further includes an upwardly extending burr adjacent planar surface at the inner diameter of the ring-shaped surface.

14. A device for wet treatment of plate-like articles, comprising:
a chuck for placing the plate-like article on and for horizontally holding the plate-like article,
the chuck having i) an upwardly facing surface at least underneath the plate-like article's edge, the upwardly facing surface being outwardly bordered by a downwardly-turned circumferential lip, ii) an outer diameter greater than the greatest diameter of the plate-like article to be treated;
a rotatable part with an upwardly facing ring-shaped surface for receiving liquid running off the downwardly-turned circumferential lip of the chuck, the ring-shaped surface located below the chuck,
wherein the rotatable part and the ring-shaped surface rotates faster than the plate-like article,
wherein the inner diameter of the ring-shaped surface is smaller than the outer diameter of the chuck so that an outermost edge that the downwardly-turned circumferential lip of the chuck overlaps an inner edge of the ring-shaped surface allowing the liquid running off the downwardly-turned circumferential lip of the chuck to fall downward onto the upwardly facing rotating ring-shaped surface of the rotatable part along a first gap therebetween, and
wherein the device is configured to operate to perform wet treatment of the plate-like article by
dispensing liquid onto the upwardly facing surface of the plate-like article,
letting the liquid flow towards the edge of the plate-like article,
letting the liquid run off the plate-like article onto the upwardly facing surface of the chuck, and
letting the liquid run off the upwardly facing surface over the downwardly-turned circumferential lip of the chuck and fall downward along the first gap onto the upwardly facing rotating ring-shaped surface of the rotatable part, whereafter the liquid is accelerated and radially spun off the rotating ring-shaped surface of the rotatable part;
wherein the rotatable part comprises air inlets positioned radially inwardly of said first gap and configured to generate an air flow upon rotation of at least one of the rotatable part and the chuck, the air flow proceeding from the air inlets radially outwardly to the first gap so as to purge the first gap.

15. The device according to claim 14, wherein the first gap defines a gas guiding channel to guide gas radially outwards over the ring-shaped surface.

16. The device according to claim 14, wherein the circumferential lip of the upwardly facing surface of the chuck is a circumferential annular lip with a bent downward, bevel-shaped edge extension, and
the bevel-shaped edge extension positioned for letting the liquid run off the upwardly facing surface and fall downward along the first gap onto the upwardly facing rotating ring-shaped surface so that the liquid runs off the bevel-shaped edge extension directly onto the ring-shaped surface of the rotatable part.

17. The device according to claim 14, wherein,
the rotating ring-shaped surface of the rotatable part is a planar surface from the inner diameter to an outermost diameter of the ring-shaped surface, and
the rotating ring-shaped surface is positioned for letting the liquid run off the upwardly facing surface and fall downward along the first gap onto the upwardly facing rotating ring-shaped surface where the liquid is accelerated and radially spun off the planar surface of the rotating ring-shaped surface.

18. The device according to claim 17, wherein,
the first gap defines a gas guiding channel guiding gas radially outwards and preventing the liquid from flowing into the gap between the chuck and the rotatable part.

* * * * *